US012663439B2

(12) United States Patent
Cheng et al.

(10) Patent No.: US 12,663,439 B2
(45) Date of Patent: Jun. 23, 2026

(54) CANTILEVER PROBE CARD DEVICE AND CANTILEVER PROBE MODULE

(71) Applicant: CHUNGHWA PRECISION TEST TECH. CO., LTD., Taoyuan City (TW)

(72) Inventors: Hao-Yen Cheng, Taoyuan City (TW); Rong-Yang Lai, Taoyuan City (TW); Chao-Hui Tseng, New Taipei City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 156 days.

(21) Appl. No.: 18/632,302

(22) Filed: Apr. 11, 2024

(65) Prior Publication Data

US 2024/0385222 A1 Nov. 21, 2024

(30) Foreign Application Priority Data

May 18, 2023 (TW) ................................ 112118422

(51) Int. Cl.
| | |
|---|---|
| *G01R 1/073* | (2006.01) |
| *G01R 1/04* | (2006.01) |
| *G01R 1/067* | (2006.01) |
| *G01R 31/00* | (2006.01) |
| *G01R 31/02* | (2006.01) |

(52) U.S. Cl.
CPC ..... *G01R 1/07342* (2013.01); *G01R 1/06727* (2013.01); *G01R 1/06733* (2013.01)

(58) Field of Classification Search
CPC .......... G01R 1/04; G01R 1/067; G01R 1/073; G01R 31/00; G01R 31/02
See application file for complete search history.

(56) References Cited

U.S. PATENT DOCUMENTS

| | | | | |
|---|---|---|---|---|
| 7,355,422 B2 * | 4/2008 | Walker | ............... | G01R 1/07342 |
| | | | | 324/754.07 |
| 2020/0348337 A1 * | 11/2020 | Vettori | ............... | G01R 1/07342 |

FOREIGN PATENT DOCUMENTS

| | | | | | |
|---|---|---|---|---|---|
| JP | 2005203606 | * | 1/2004 | ............. | G01R 1/073 |
| WO | WO-2005065438 A2 | * | 7/2005 | ......... | G01R 1/06727 |

* cited by examiner

*Primary Examiner* — Neel D Shah
(74) *Attorney, Agent, or Firm* — Li & Cai Intellectual Property Office

(57) ABSTRACT

A cantilever probe module includes a plurality of first probes and a plurality of second probes. Each of the first probes includes a first arm segment, a first main segment, and a first testing segment, the latter two of which are respectively connected to two ends of the first arm segment. Each of the second probes includes a second arm segment, an extending segment and a second testing segment both respectively connected to two ends of the second arm segment, and a second main segment that is connected to the extending segment. A height of the extending segment is 5% to 50% of a height of the second main segment. When the first main segments of the first probes and the second main segments of the second probes are staggeredly fixed onto a substrate, the first testing segments and the second testing segments are arranged in one row.

9 Claims, 10 Drawing Sheets

1

CANTILEVER PROBE CARD DEVICE AND CANTILEVER PROBE MODULE

CROSS-REFERENCE TO RELATED PATENT APPLICATION

This application claims the benefit of priority to Taiwan Patent Application No. 112118422, filed on May 18, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a cantilever probe card, and more particularly to a cantilever probe card device and a cantilever probe module.

BACKGROUND OF THE DISCLOSURE

A conventional cantilever probe card includes a substrate and a plurality of cantilever probes that are mounted on the substrate and that have substantially the same shape. In order to allow testing segments of the cantilever probes to be arranged in one row, the cantilever probes have to be fixed on to soldering pads of the substrate that are also arranged in one row. However, in the conventional cantilever probe card, any adjacent two of the soldering pads arranged in one row have a spacing therebetween that needs to be reduced for accommodating the miniaturization of a device under test (DUT), thereby easily resulting in defects in a soldering process.

SUMMARY OF THE DISCLOSURE

In response to the above-referenced technical inadequacies, the present disclosure provides a cantilever probe card device and a cantilever probe module for effectively improving on the issues associated with conventional cantilever probe cards.

In order to solve the above-mentioned problems, one of the technical aspects adopted by the present disclosure is to provide a cantilever probe card device, which includes a substrate and a cantilever probe module fixed onto the substrate. The substrate includes a plurality of first soldering pads and a plurality of second soldering pads. The first soldering pads are arranged in a first row along an arrangement direction, and the second soldering pads are arranged in a second row along the arrangement direction. The second row is parallel to and spaced apart from the first row. The cantilever probe module includes a plurality of first probes and a plurality of second probes that are staggeredly arranged with the first probes. Each of the first probes is integrally formed as a single one-piece structure, and includes a first main segment, a first arm segment, and a first testing segment. The first main segment has a first soldering end portion and a first extending end portion respectively arranged on two opposite sides thereof along a predetermined direction that is perpendicular to the arrangement direction. The first arm segment is connected to the first extending portion of the first main segment. The first testing segment has an upright shape along the predetermined direction and is connected to the first arm segment. Each of the second probes is integrally formed as a single one-piece structure, and includes a second main segment, an extending segment, a second arm segment, and a second testing segment. The second main segment has a second soldering end portion and a second extending end portion respectively arranged on two opposite sides thereof along the predetermined direction. The second main segment has a main height along the predetermined direction. The extending segment is connected to the second main segment. The extending segment has an extension height along the predetermined direction. The extension height is within a range from 5% to 50% of the main height. The second arm segment is connected to the extending segment. The second testing segment has an upright shape along the predetermined direction and is connected to the second arm segment. The first soldering end portions of the first probes are fixed onto the first soldering pads, the second soldering end portions of the second probes are fixed onto the second soldering pads, and the first testing segments of the first probes and the second testing segments of the second probes are arranged in one row along the arrangement direction. When the first testing segments of the first probes and the second testing segments of the second probes jointly abut against a device under test (DUT), a pressure generated in the first testing segment of any one of the first probes is within a range from 95% to 105% of a pressure generated in the second testing segment of any one of the second probes.

In order to solve the above-mentioned problems, another one of the technical aspects adopted by the present disclosure is to provide a cantilever probe module, which includes a plurality of first probes and a plurality of second probes that are staggeredly arranged with the first probes. Each of the first probes is integrally formed as a single one-piece structure, and includes a first main segment, a first arm segment, and a first testing segment. The first main segment has a first soldering end portion and a first extending end portion respectively arranged on two opposite sides thereof along a predetermined direction. The first arm segment is connected to the first extending portion of the first main segment. The first testing segment has an upright shape along the predetermined direction and is connected to the first arm segment. Each of the second probes is integrally formed as a single one-piece structure, and includes a second main segment, an extending segment, a second arm segment, and a second testing segment. The second main segment has a second soldering end portion and a second extending end portion respectively arranged on two opposite sides thereof along the predetermined direction. The second main segment has a main height along the predetermined direction. The extending segment is connected to the second main segment. The extending segment has an extension height along the predetermined direction. The extension height is within a range from 5% to 50% of the main height. The second arm segment is connected to the extending segment. The second testing segment has an upright shape along the predetermined direction and is connected to the second arm segment. When the first soldering end portions of the first probes and the second soldering end portions of the second probes are fixed onto a substrate, the first testing segments of the first probes and the second testing segments of the second probes are arranged in one row along an arrangement direction perpendicular to the predetermined direction.

Therefore, in any one of the cantilever probe card device and the cantilever probe module of the present disclosure, each of the second probes is provided with the extending segment that is arranged between the second main segment and the second arm segment and that has a specific condition (e.g., the extension height being within a range from 5% to 50% of the main height), so that the second probes and the first probes can be in cooperation with each other for being fixed onto the second soldering pads in the second row and the first soldering pads in the first row, and the second probes and the first probes can have substantially same pressure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
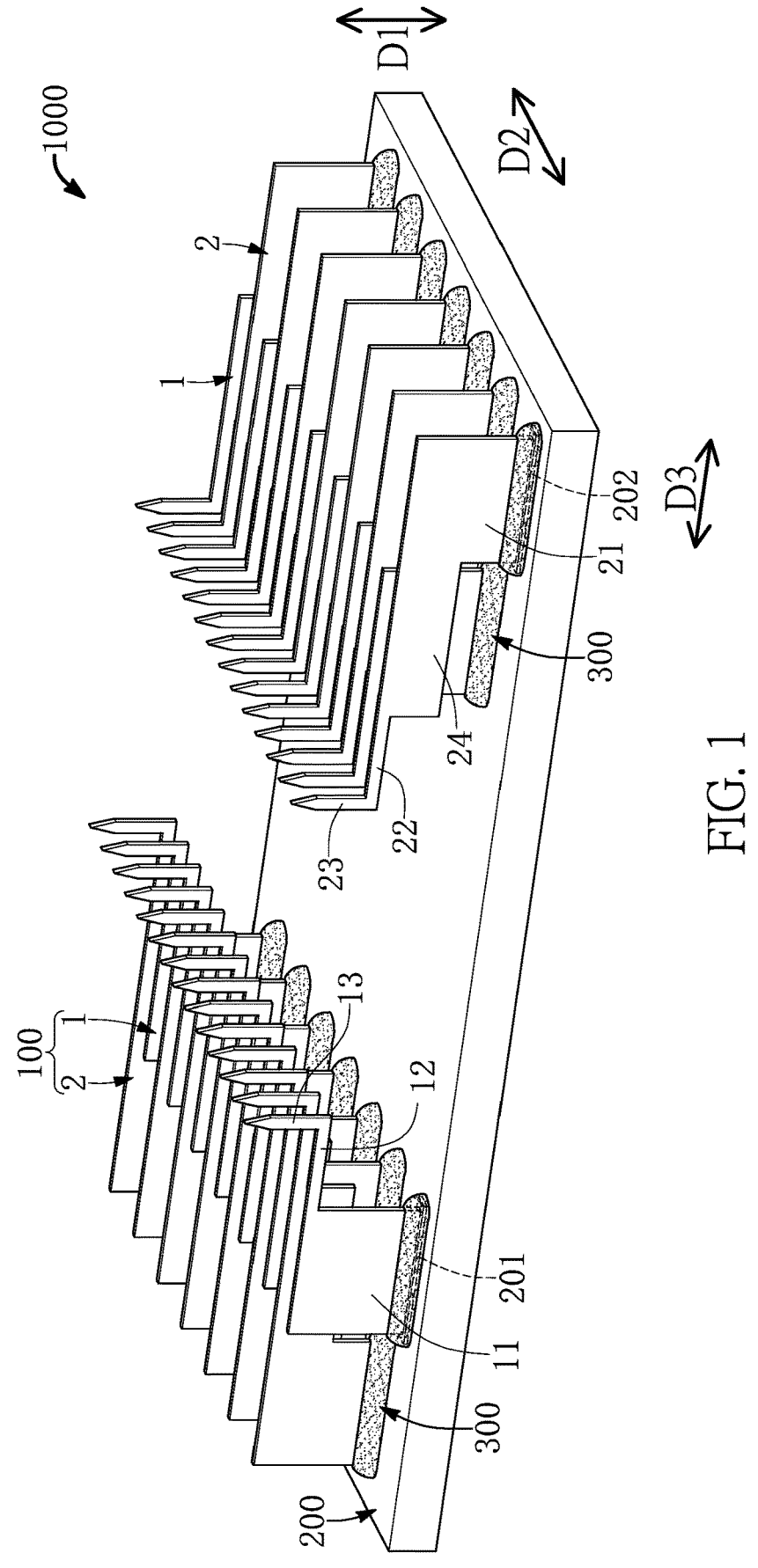
FIG. 1 is a schematic perspective view of a cantilever probe card device according to a first embodiment of the present disclosure.
Figure 2:
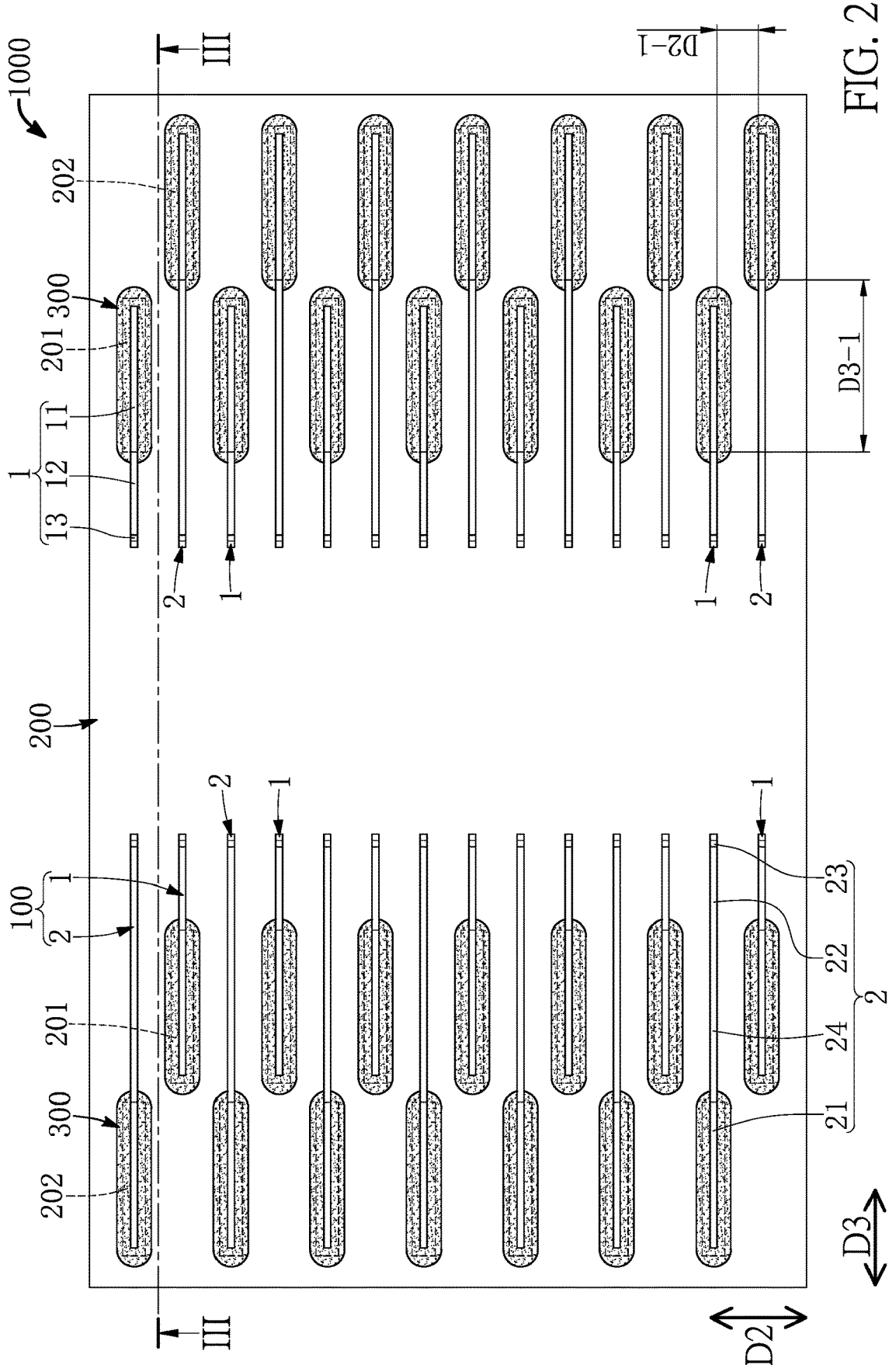
FIG. 2 is a schematic top view of FIG. 1.
Figure 3:
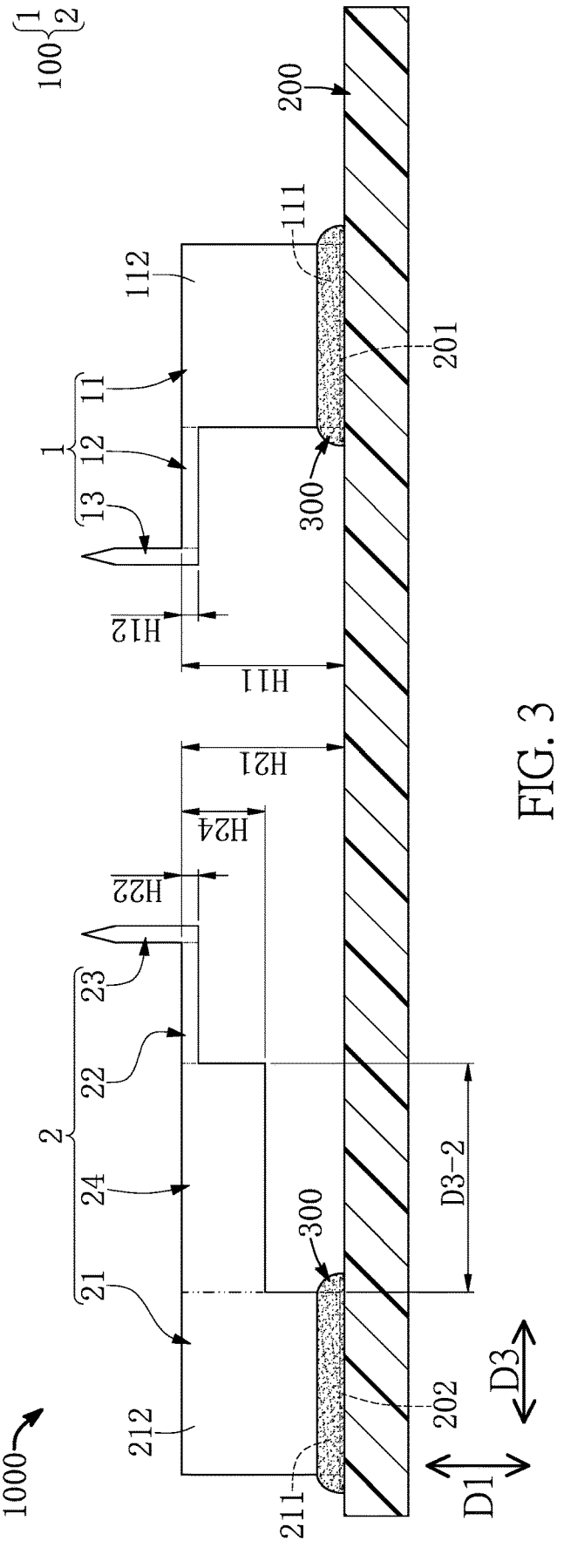
FIG. 3 is a schematic cross-sectional view taken along line III-III of FIG. 2.
Figure 4:
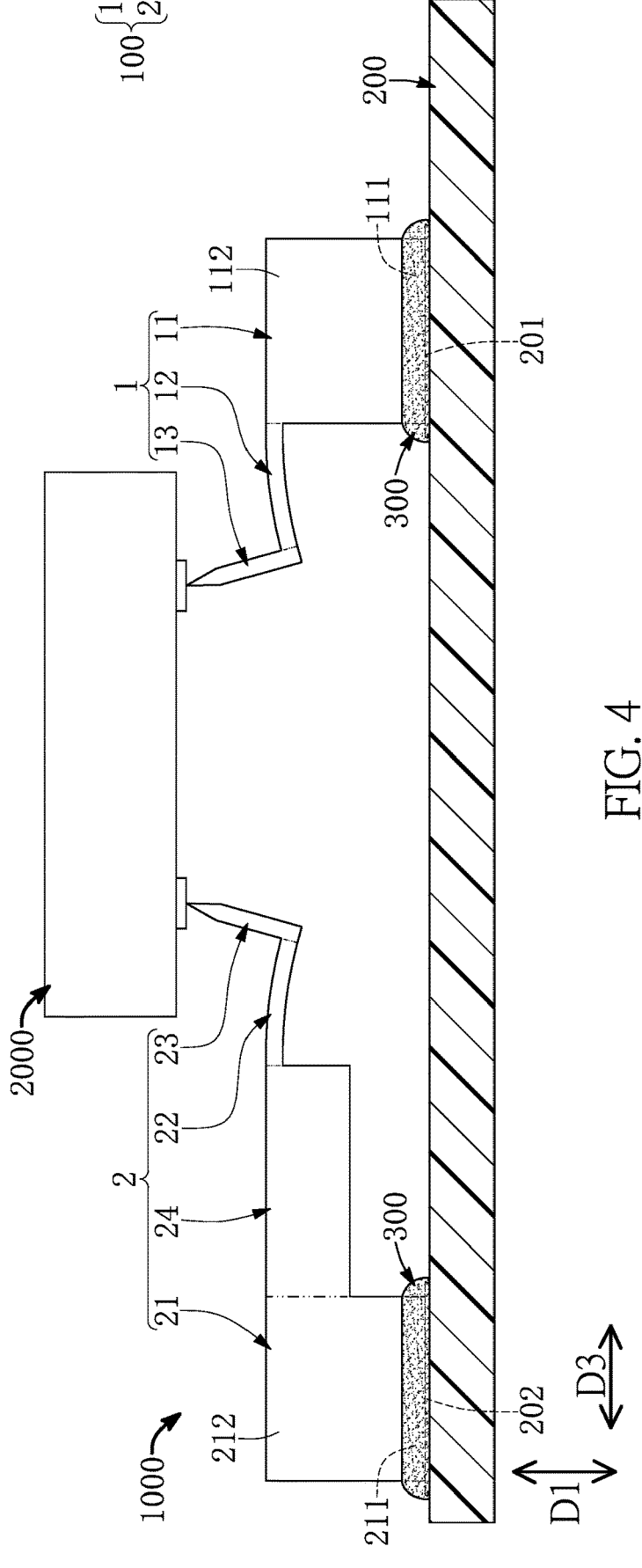
FIG. 4 is a schematic cross-sectional view showing the cantilever probe card device of FIG. 3 that abuts against a device under test (DUT)

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a cantilever probe card device 1000, which includes a substrate 200, a plurality of solders 300, and at least one cantilever probe module 100 that is fixed onto the substrate 200 through the solders 300, but the present disclosure is not limited thereto. It should be noted that any probe module not in a cantilever mode is different from the cantilever probe module 100 provided by the present embodiment.

In the present embodiment, a quantity of the at least one cantilever probe module 100 is two, and the two cantilever probe modules 100 are respectively disposed on two opposite portions of the substrate 200, but the present disclosure is not limited thereto. For example, in other embodiments of the present disclosure not shown in the drawings, the quantity of the at least one cantilever probe module 100 can be four, and the four cantilever probe modules 100 are disposed on a peripheral portion of the substrate 200 in an annular arrangement; or, the quantity of the at least one cantilever probe module 100 can be one. In order to clearly describe the present embodiment, the following description discloses the structure of just one of the two cantilever probe modules 100.

In addition, the cantilever probe module 100 in the present embodiment is described in cooperation with the substrate 200 and the solders 300, but the present disclosure is not limited thereto. For example, in other embodiments of the present disclosure not shown in the drawings, the cantilever probe module 100 can be independently used (e.g., sold) or can be used in cooperation with other components.

In the present embodiment, the substrate 200 is a flat board and defines a predetermined direction D1 perpendicular thereto, an arrangement direction D2 perpendicular to the predetermined direction D1, and an extending direction D3 that is perpendicular to the predetermined direction D1 and the arrangement direction D2, but the present disclosure is not limited thereto.

Specifically, the substrate 200 includes a plurality of first soldering pads 201 and a plurality of second pads 202. The first soldering pads 201 are arranged in a first row along the arrangement direction D2, and the second soldering pads 202 are arranged in a second row along the arrangement direction D2. The second row is parallel to and spaced apart from the first row. The first soldering pads 201 of the first row are spaced apart from the second soldering pads 202 of the second row by an offset distance D3-1 along the extending direction D3.

The cantilever probe module 100 includes a plurality of first probes 1 and a plurality of second probes 2. The first probes 1 and the second probes 2 are staggeredly arranged with each other along the arrangement direction D2 and are fixed onto the substrate 200. In the present embodiment, any one of the first probes 1 and an adjacent one of the second probes 2 have a spacing D2-1 along the arrangement direction D2. The spacing D2-1 is within a range from 20 μm to 200 μm.

Each of the first probes 1 is integrally formed as a single one-piece structure. As the first probes 1 in the present embodiment are of substantially the same structure (e.g., outer contours of the first probes 1 are flush with each other along the arrangement direction D2), the following description discloses the structure of just one of the first probes 1 for the sake of brevity, but the present disclosure is not limited thereto. For example, in other embodiments of the present disclosure not shown in the drawings, the first probes 1 can be of different structures.

The first probe 1 includes a first main segment 11, a first arm segment 12 connected to the first main segment 11, and a first testing segment 13 that is connected to the first arm segment 12. In other words, the first main segment 11, the first arm segment 12, and the first testing segment 13 are sequentially connected along the extending direction D3. Specifically, the first main segment 11 and the first testing segment 13 are respectively connected to two opposite ends of the first arm segment 12, and are respectively located at two diagonal sides of the first arm segment 12.

In the present embodiment, the first main segment 11 has a substantially sheet-like shape (e.g., a rectangular sheet), and the first main segment 11 has a first soldering end portion 111 and a first extending end portion 112 respectively arranged on two opposite sides thereof along the predetermined direction D1. The first arm segment 12 is an elongated structure along the extending direction D3, and one end of the first arm segment 12 is connected to the first extending end portion 112 of the first main segment 11. The first testing segment 13 has an upright shape along the predetermined direction D1 and is connected to another end of the first arm segment 12.

In other words, an edge of the first soldering end portion 111 is flush with an edge of the first arm segment 12 so as to jointly form a straight line that is substantially perpendicular to an edge of the first testing segment 13. Moreover, along the predetermined direction D1, a height H12 of the first arm segment 12 is within a range from 5% to 50% of a height H11 of the first main segment 11, the first arm segment 12 is elastically deformable, and the first main segment 11 does not have any deformation.

Each of the second probes 2 is integrally formed as a single one-piece structure. As the second probes 2 in the present embodiment are of substantially the same structure (e.g., outer contours of the second probes 2 are flush with each other along the arrangement direction D2), the following description discloses the structure of just one of the second probes 2 for the sake of brevity, but the present disclosure is not limited thereto. For example, in other embodiments of the present disclosure not shown in the drawings, the second probes 2 can be of different structures.

The second probe 2 includes a second main segment 21, an extending segment 24 connected to the second main segment 21, a second arm segment 22 connected to the extending segment 24, and a second testing segment 23 that is connected to the second arm segment 22. In other words, the second main segment 21, the extending segment 24, the second arm segment 22, and the second testing segment 23 are sequentially connected along the extending direction D3. Specifically, the extending segment 24 and the second testing segment 23 are respectively connected to two opposite ends of the second arm segment 22, and are respectively located at two diagonal sides of the second arm segment 22.

In other words, shapes of the first main segment 11, the first arm segment 12, and the first testing segment 13 of any one of the first probes 1 are respectively identical to shapes of the second main segment 21, the second arm segment 22, and the second testing segment 23 of any one of the second probes 2, but the present disclosure is not limited thereto. For example, in other embodiments of the present disclosure not shown in the drawings, the shapes of the first main segment 11, the first arm segment 12, and the first testing segment 13 of any one of the first probes 1 can be respectively different from the shapes of the second main segment 21, the second arm segment 22, and the second testing segment 23 of any one of the second probes 2.

In the present embodiment, the second main segment 21 has a substantially sheet-like shape (e.g., a rectangular sheet), and the second main segment 21 has a second soldering end portion 211 and a second extending end portion 212 respectively arranged on two opposite sides thereof along the predetermined direction D1. The extending segment 24 also has a substantially sheet-like shape, and one end of the extending segment 24 is connected to the second main segment 21. The second arm segment 22 is an elongated structure along the extending direction D3, and one end of the second arm segment 22 is connected to another end of the extending segment 24. The second testing segment 23 has an upright shape along the predetermined direction D1 and is connected to another end of the second arm segment 22.

In other words, an edge of the second soldering end portion 211 is flush with an edge of the extending segment 24 and an edge of the second arm segment 22 so as to jointly form a straight line that is substantially perpendicular to an edge of the second testing segment 23. Moreover, along the predetermined direction D1, the second main segment 21 has a main height H21, the extending segment 24 has an extension height H24 that is within a range from 5% to 80% (e.g., 5% to 50%) of the main height H21, and the second arm segment 22 has an arm height H22 that is within a range from 5% to 50% of the extension height H24.

In other words, along the predetermined direction D1, the extension height H24 is calculated from a portion of the extending segment 24 connected to the second main segment 21, and the arm height H22 is calculated from a portion of the extending segment 24 connected to the second arm segment 22. The second arm segment 22 is elastically deformable, and the second main segment 21 and the extending segment 24 do not have any deformation.

Specifically, the extending segment 24 has an extension distance D3-2 along the extending direction D3. The extending direction D3-2 is within a range from 95% to 105% (e.g., 98% to 102%) of the offset distance D3-1. Accordingly, the second probes 2 can be arranged to eliminate affects generated from the offset distance D3-1 through the extending segments 24, such that the second arm segments 22 of the second probes 2 and the first arm segments 12 of the first probes 1 can have substantially same effect.

The above description describes the structures of the first probe 1 and the second probe 2, and the following description describes connection relationship between the cantilever probe module 100 and other components. The first soldering end portion 111 of any one of the first probes 1 is soldered and fixed onto one of the first soldering pads 201 through one of the solders 300, the second soldering end portion 211 of any one of the second probes 2 is soldered and fixed onto one of the second soldering pads 202 through one of the solders 300, and the first testing segments 13 of the first probes 1 and the second testing segments 23 of second probes 2 are arranged in one row along the arrangement direction D2.

In the present embodiment, the soldering manner between the first soldering end portion 111 and the first soldering pad 201 and/or the soldering manner between the second soldering end portion 211 and the second soldering pad 202 can be changed or adjusted according to design requirements. For example, the above soldering manner can be a surface mount technology (SMT) manner, a pin-in-paste (PIP) manner, or other soldering manners, but the present disclosure is not limited thereto.

When the first testing segments 13 of the first probes 1 and the second testing segments 23 of the second probes 2 jointly abut against a device under test (DUT) 2000, a pressure (or a contact force) generated in the first testing segment 13 of any one of the first probes 1 is within a range from 95% to 105% (e.g., 98% to 102%) of a pressure (or a contact force) generated in the second testing segment 23 of any one of the second probes 2, each of the first probes 1 is preferably deformed only in the first arm segment 12, and each of the second probes 2 is preferably deformed only in the second arm segment 22, but the present disclosure is not limited thereto.

In summary, in the cantilever probe card device 1000 (or the cantilever probe module 100) of the present embodiment, each of the second probes 2 is provided with the extending segment 24 that is arranged between the second main segment 21 and the second arm segment 22 and that has a specific condition (e.g., the extension height H24 is within a range from 5% to 50% of the main height H21), so that the second probes 2 and the first probes 1 can be in cooperation with each other for being fixed onto the second soldering pads 202 in the second row and the first soldering pads 201 in the first row, and the second probes 2 and the first probes 1 can have substantially the same pressure (or the same contact force).

Second Embodiment

Figure 5:
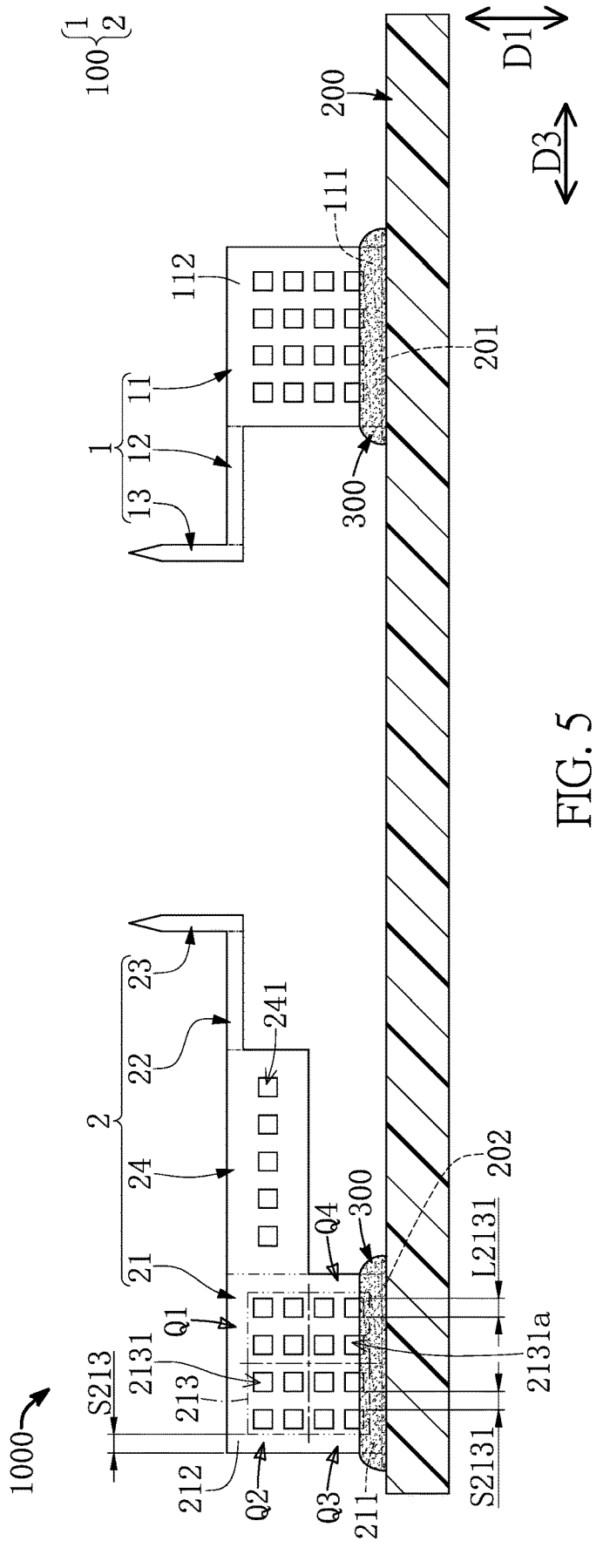
FIG. 5 is a schematic cross-sectional view of the cantilever probe card device according to a second embodiment of the present disclosure.
Figure 6:
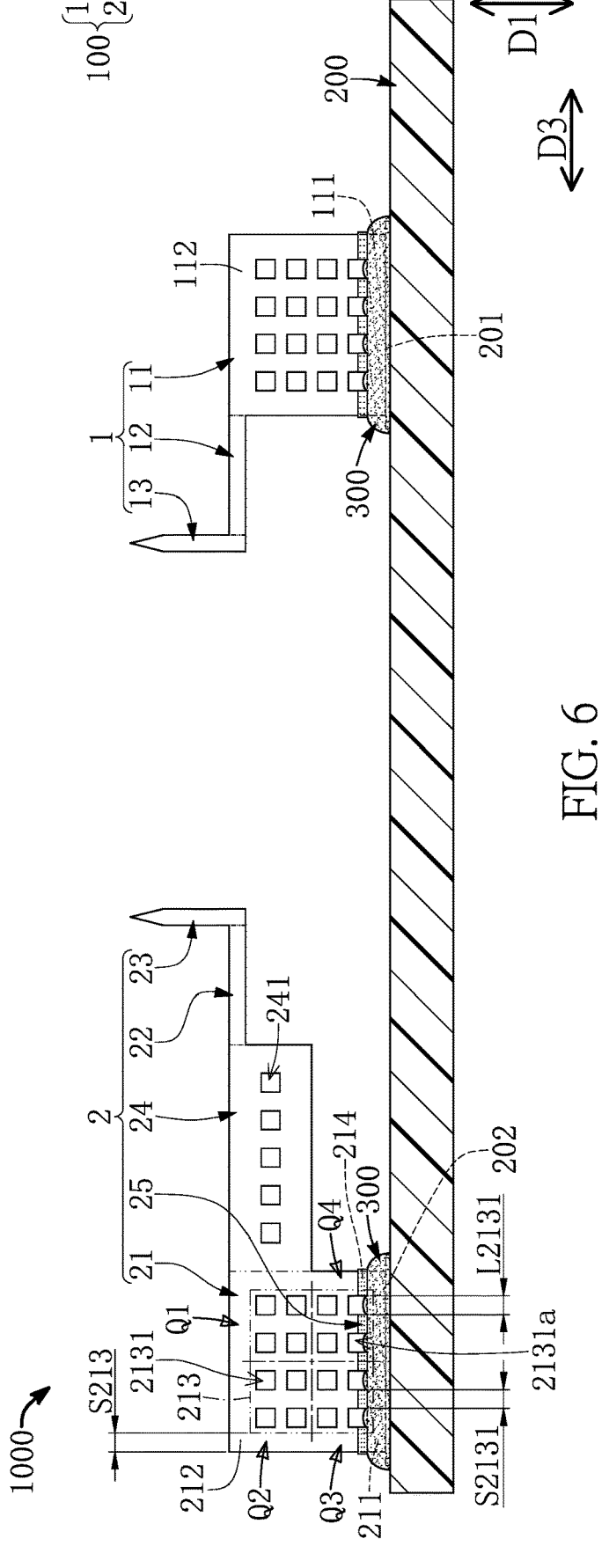
FIG. 6 is a schematic cross-sectional view of the cantilever probe card device in another configuration according to the second embodiment of the present disclosure.

Referring to FIG. 5 and FIG. 6, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

It should be noted that each of the first probe 1 and the second probe 2 in the present embodiment is a micro electro mechanical system (MEMS) probe. In a manufacturing process, one side of the MEMS probe is coated with a photoresist layer (not shown in the drawings) that needs to be removed by a specific solution, but the photoresist layer formed on a larger region (e.g., the first main segment 11 or the second main segment 21) of the MEMS probe is difficult to be removed by the specific solution.

Moreover, the shapes of the first main segment 11, the first arm segment 12, and the first testing segment 13 of any one of the first probes 1 in the present embodiment are respectively identical to the shapes of the second main segment 21, the second arm segment 22, and the second testing segment 23 of any one of the second probes 2.

In order to clearly describe the present embodiment, the following description only describes the structure of the second probe 2, but the present disclosure is not limited thereto. For example, in other embodiments of the present disclosure not shown in the drawings, the shapes of the first main segment 11, the first arm segment 12, and the first testing segment 13 of any one of the first probes 1 can be respectively different from the shapes of the second main segment 21, the second arm segment 22, and the second testing segment 23 of any one of the second probes 2.

In the present embodiment, the second main segment 21 defines a layout region 213 arranged inside of an outer contour thereof, and the second soldering end portion 211 and the second extending end portion 212 are respectively located at two opposite sides of the layout region 213 along the predetermined direction D1. The layout region 213 has a plurality of thru-holes 2131 that occupy 3% to 70% of a region surroundingly defined by the outer contour of the second main segment 21.

In the present embodiment, the thru-holes 2131 are in a matrix arrangement having a plurality of rows, and the thru-holes 2131 are uniformly distributed on the second main segment 21. In other words, the second main segment 21 is divided into four quadrants Q1, Q2, Q3, Q4 by taking a center point thereof as an origin point, and a ratio of thru-holes 2131 in any one of the four quadrants Q1, Q2, Q3, Q4 is within a range from 95% to 105% of a ratio of the thru-holes 2131 in another one of the four quadrants Q1, Q2, Q3, Q4, but the present disclosure is not limited thereto.

Specifically, the layout region 213 is spaced apart from the outer contour of the second main segment 21 by a layout spacing S213 that is greater than or equal to an inner diameter L2131 of any one of the thru-holes 2131. In the present embodiment, the layout spacing S213 is preferably within a range from 20 μm to 100 μm, the inner diameter L2131 of any one of the thru-holes 2131 is less than or equal to 100 μm, and any two of the thru-holes 2131 adjacent to each other have a spacing S2131 therebetween that is within a range from 10 μm to 50 μm, thereby effectively preventing the structural strength of the second main segment 21 from being affected, but the present disclosure is not limited thereto.

In summary, in the cantilever probe card device 1000 (or the cantilever probe module 100) of the present embodiment, the layout region 213 has the thru-holes 2131, so that the solution in the MEMS process can completely remove the photoresist layer by flowing through the thru-holes 2131, thereby increasing the production yield.

In addition, when the extending segment 24 of the second probe 2 has a larger area, the extending segment 24 can further have at least one thru-hole 241, thereby allowing the solution to remove the photoresist layer by passing through the at least one thru-hole 241.

Moreover, the thru-holes 2131 in one of the rows are arranged adjacent to the second soldering end portion 211 and are each defined as a solder receiving hole 2131a. The solder receiving holes 2131a of the row are preferably not located in a region defined by extending the extending segment 24 along the extending direction D3, and each of the solder receiving holes 2131a receives a part of the corresponding solder 300, but the present disclosure is not limited thereto. For example, in other embodiments of the present disclosure not shown in the drawings, according design requirements, any one of the solder receiving holes 2131a can be provided without receiving any part of the corresponding solder 300.

In the present embodiment, the second probe 2 includes a plurality of supporting arms 214 that are arranged on the second main segment 21 and a plurality of organic insulation layers 25 that respectively cover the supporting arms 214. The supporting arms 214 and the solder receiving holes 2131a are arranged in one row, and any two of the supporting arms 214 adjacent to each other are provided with one of the solder receiving holes 2131a therebetween. In other words, any one of the supporting arms 214 is preferably embedded in one of the organic insulation layers 25, thereby preventing the corresponding solder 300 from climbing along the supporting arms 214. Accordingly, a climbing height of the solder 300 climbing on the second probe 2 can be precisely controlled for effectively maintaining the stability of the soldering process of the second probe 2.

Third Embodiment

Figure 7:
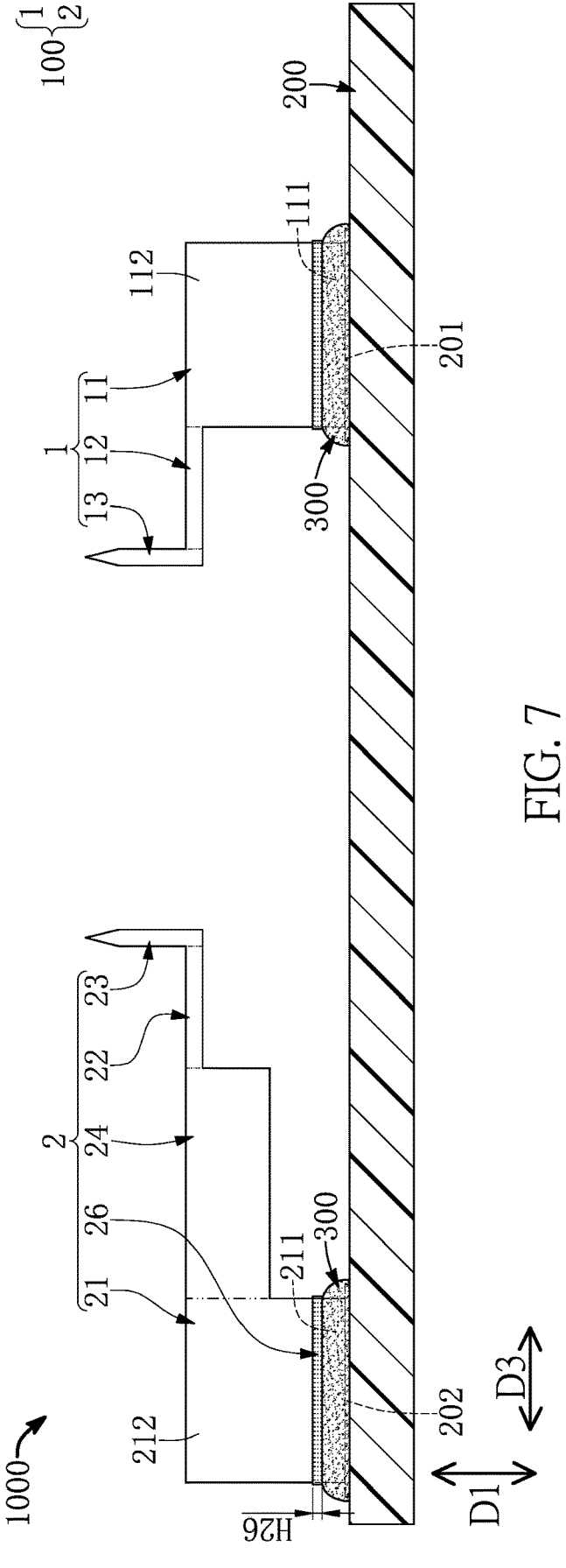
FIG. 7 is a schematic cross-sectional view of the cantilever probe card device according to a third embodiment of the present disclosure.
Figure 8:
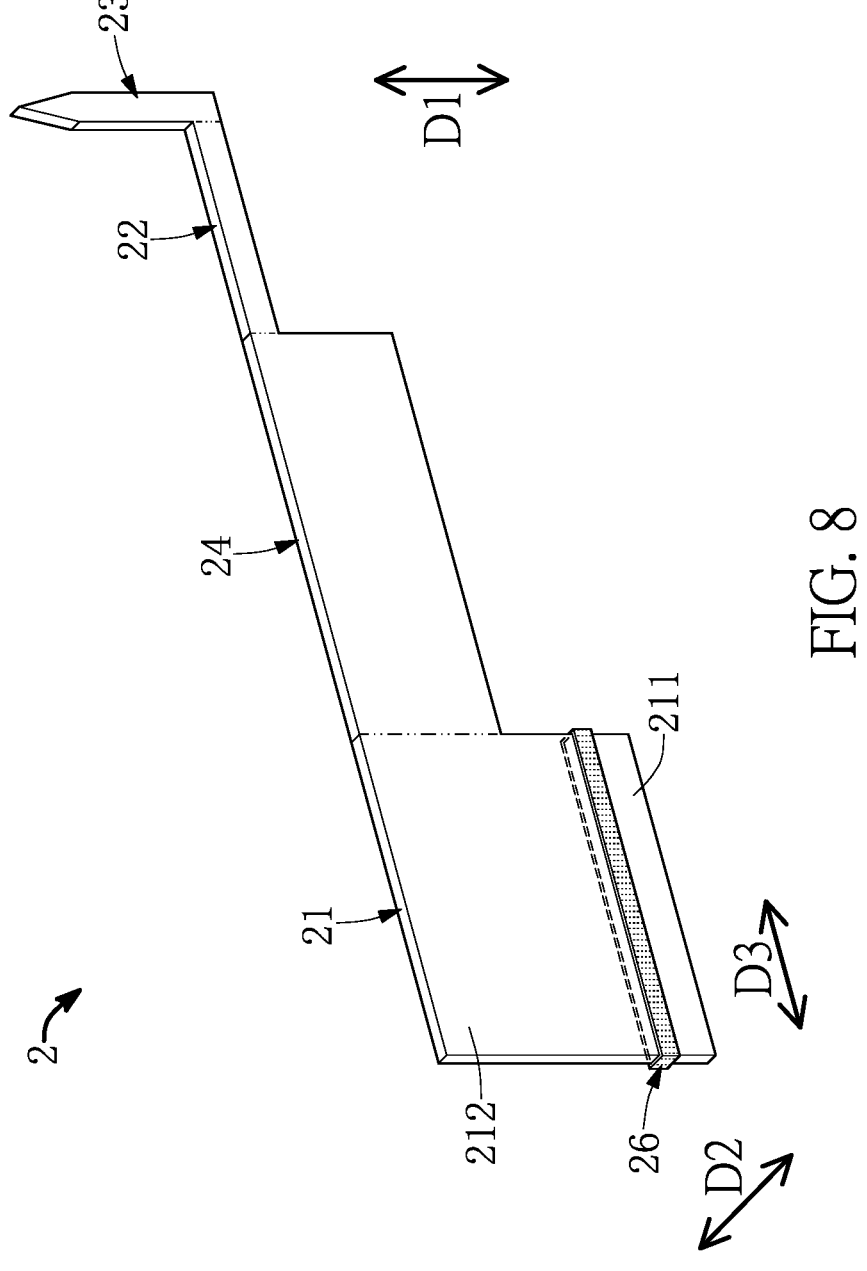
FIG. 8 is a schematic perspective view showing a second probe of FIG. 7.

Referring to FIG. 7 and FIG. 8, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

It should be noted that the shapes of the first main segment 11, the first arm segment 12, and the first testing segment 13 of any one of the first probes 1 in the present embodiment are respectively identical to the shapes of the second main segment 21, the second arm segment 22, and the second testing segment 23 of any one of the second probes 2.

In order to clearly describe the present embodiment, the following description only describes the structure of the second probe 2, but the present disclosure is not limited thereto. For example, in other embodiments of the present disclosure not shown in the drawings, the shapes of the first main segment 11, the first arm segment 12, and the first testing segment 13 of any one of the first probes 1 can be respectively different from the shapes of the second main segment 21, the second arm segment 22, and the second testing segment 23 of any one of the second probes 2.

In the present embodiment, the second probe 2 further includes a climb-restricting ring 26 formed on the second main segment 21. The climb-restricting ring 26 can be made of an organic insulation material (e.g., photoresist) or other materials (e.g., metal) that can block the solder 300 from climbing thereon. The climb-restricting ring 26 can be formed on the second main segment 21 in any manner (e.g., a coating manner, an adhering manner, a printing manner, or a deposition manner), and the present disclosure is not limited thereto.

Specifically, the climb-restricting ring 26 is not in contact with the second soldering end portion 211 and surrounds the second main segment 21 along a top edge of the second soldering end portion 211. The climb-restricting ring 26 protrudes from an outer surface of the second main segment 21 by a thickness that is preferably within a range from 1 μm to 10 μm. Moreover, the climb-restricting ring 26 has a restriction height H26 along the predetermined direction D1, and the restriction height H26 is within a range from 3 μm to 50 μm. Accordingly, the climb-restricting ring 26 is capable of blocking the corresponding solder 300 on the second soldering end portion 211, such that the corresponding solder 300 cannot climb past the climb-restricting ring 26 along the predetermined direction D1.

In summary, in the cantilever probe card device 1000 (or the cantilever probe module 100) of the present embodiment, the second probe 2 is provided with the climb-restricting ring 26 at a specific position, so that a climbing height of the solder 300 climbing on the second probe 2 can be precisely controlled for effectively maintaining the stability of the soldering process of the second probe 2.

Fourth Embodiment

Figure 9:
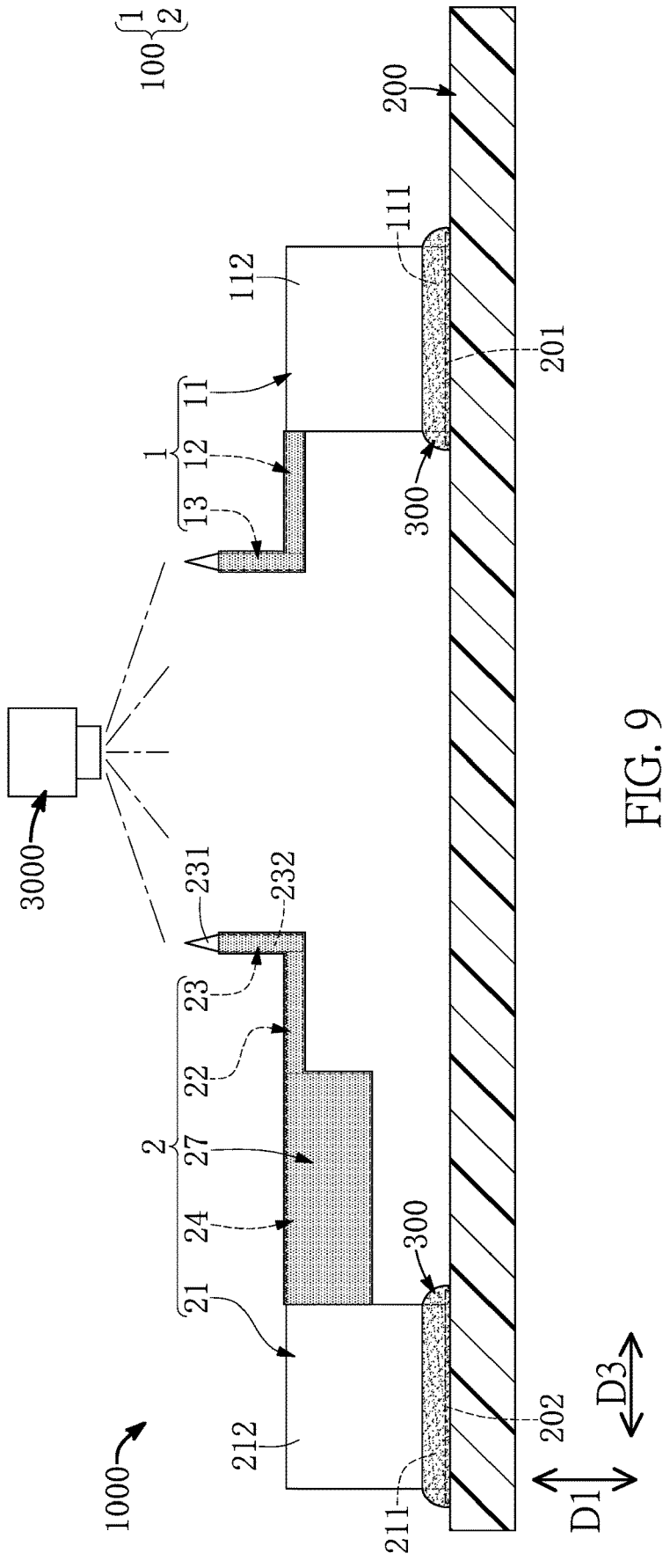
FIG. 9 is a schematic cross-sectional view of the cantilever probe card device according to a fourth embodiment of the present disclosure.

Referring to FIG. 9, a fourth embodiment of the present disclosure, which is similar to the first embodiment of the present disclosure, is provided. For the sake of brevity, descriptions of the same components in the first and fourth embodiments of the present disclosure will be omitted herein, and the following description only discloses different features between the first and fourth embodiments.

It should be noted that the shapes of the first main segment 11, the first arm segment 12, and the first testing segment 13 of any one of the first probes 1 in the present embodiment are respectively identical to the shapes of the second main segment 21, the second arm segment 22, and the second testing segment 23 of any one of the second probes 2.

In order to clearly describe the present embodiment, the following description only describes the structure of the second probe 2, but the present disclosure is not limited thereto. For example, in other embodiments of the present disclosure not shown in the drawings, the shapes of the first main segment 11, the first arm segment 12, and the first testing segment 13 of any one of the first probes 1 can be respectively different from the shapes of the second main segment 21, the second arm segment 22, and the second testing segment 23 of any one of the second probes 2.

In the present embodiment, the second testing segment 23 of the second probe 2 includes a pinpoint portion 231 and an upright portion 232 that connects the pinpoint portion 231 and the second arm segment 22, and the second probe 2 further includes a light absorption coating layer 27. The upright portion 232, the second arm segment 22, and the extending segment 24 are covered by (or embedded in) the light absorption coating layer 27 (i.e., the light absorption coating layer 27 covers the upright portion 232, and further extends to cover the second arm segment 22 and the extending segment 24), and the pinpoint portion 231 is exposed from the light absorption coating layer 27.

Accordingly, through the light absorption coating layer 27, the testing segment 23, the second arm segment 22, and the extending segment 24 only form an observation point at the pinpoint portion 231 in an observation process of a detection apparatus 3000, but the present disclosure is not limited thereto. For example, in other embodiments of the present disclosure not shown in the drawings, the light absorption coating layer 27 can only cover the upright portion 232 therein, so that the testing segment 23 only forms the observation point at the pinpoint portion 231 in the observation process of the detection apparatus 3000.

Specifically, in the observation process, the detection apparatus 3000 is operated by using light to irradiate on the second probes 2 for obtaining the observation point of the pinpoint portion 231 of each of the second probes 2. Moreover, a light absorption ratio of the light absorption coating layer 27 corresponding to the light is greater than or equal to 60%, and the light absorption coating layer 27 is preferably made of a polymer material, an organic material, a nano-material, or a light absorption composite material, but the present disclosure is not limited thereto.

In summary, in the cantilever probe card device 1000 (or the cantilever probe module 100) of the present embodiment, the second probe 2 is provided with the light absorption coating layer 27 formed on a region thereof adjacent to the pinpoint portion 231, so that the detection apparatus 3000 can precisely obtain the position of the pinpoint portion 231 for facilitating the operation of the cantilever probe card device 1000.

Fifth Embodiment

Figure 10:
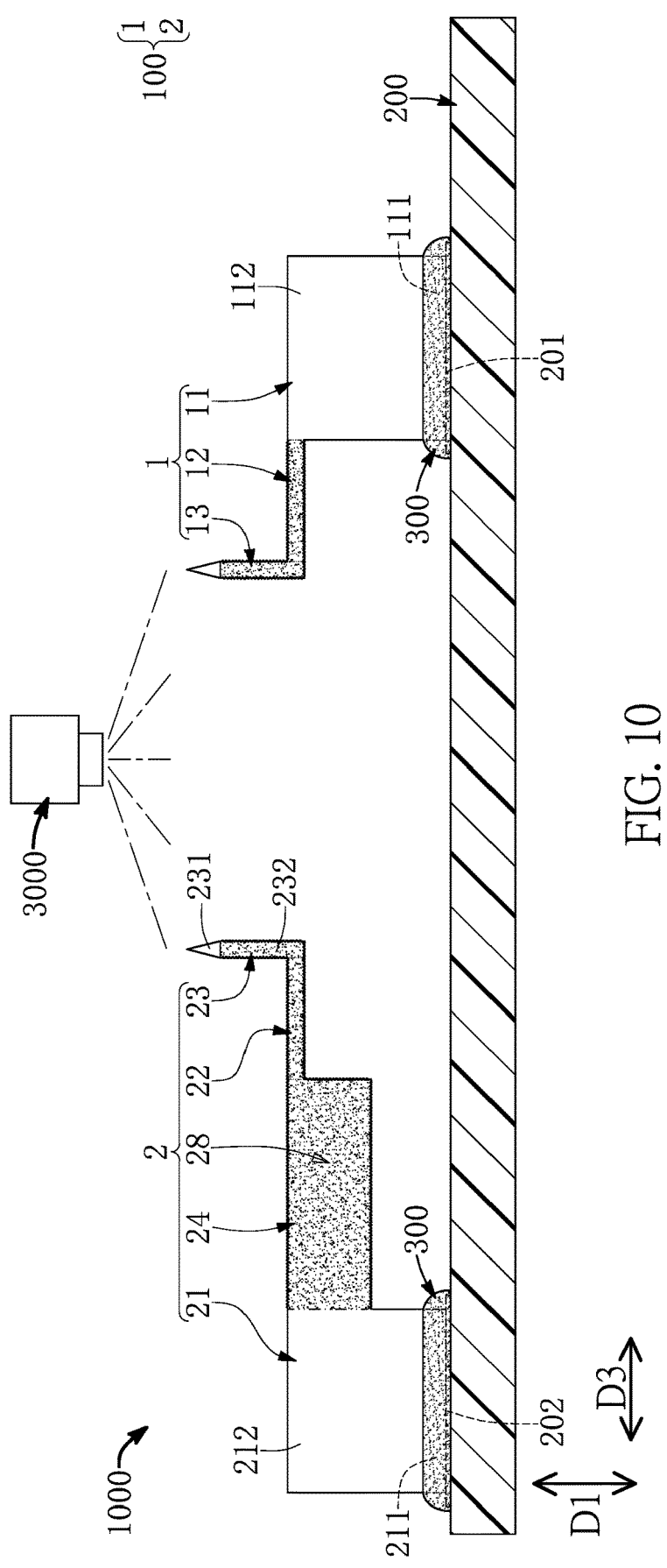
FIG. 10 is a schematic cross-sectional view of the cantilever probe card device according to a fifth embodiment of the present disclosure.

Referring to FIG. 10, a fifth embodiment of the present disclosure, which is similar to the first embodiment of the present disclosure, is provided. For the sake of brevity, descriptions of the same components in the first and fifth embodiments of the present disclosure will be omitted herein, and the following description only discloses different features between the first and fifth embodiments.

It should be noted that the shapes of the first main segment 11, the first arm segment 12, and the first testing segment 13 of any one of the first probes 1 in the present embodiment are respectively identical to the shapes of the second main segment 21, the second arm segment 22, and the second testing segment 23 of any one of the second probes 2.

In order to clearly describe the present embodiment, the following description only describes the structure of the second probe 2, but the present disclosure is not limited thereto. For example, in other embodiments of the present disclosure not shown in the drawings, the shapes of the first main segment 11, the first arm segment 12, and the first testing segment 13 of any one of the first probes 1 can be respectively different from the shapes of the second main segment 21, the second arm segment 22, and the second testing segment 23 of any one of the second probes 2.

In the present embodiment, the second testing segment 23 of the second probe 2 includes a pinpoint portion 231 and an upright portion 232 that connects the pinpoint portion 231 and the second arm segment 22, and the second probe 2 further has a roughened surface 28 arranged on an entirety of an outer surface of the upright portion 232. The roughened surface 28 has an arithmetic average roughness (Ra) within a range from 0.1 μm to 1 μm. In the present embodiment, the roughened surface 28 extends from the upright portion 232 to be further formed on (an entire outer surface of) the second arm segment 22 and (an entire outer surface of) the extending segment 24.

Accordingly, through the roughened surface 28, the second testing segment 23, the second arm segment 22, and the extending segment 24 only form an observation point at the pinpoint portion 231 in an observation process of a detection apparatus 3000, but the present disclosure is not limited thereto. For example, in other embodiments of the present disclosure not shown in the drawings, the roughened surface 28 can be only formed on the upright portion 232 or can be only formed on the upright portion 232 and the second arm segment 22, thereby only forming the observation point at the pinpoint portion 231 in the observation process of the detection apparatus 3000.

Specifically, in the observation process, the detection apparatus 3000 is operated by using light to irradiate on the second probes 2 for obtaining the observation point of the pinpoint portion 231 of each of the second probes 2. Moreover, the roughened surface 28 is capable of scattering the light irradiated thereon, but the present disclosure is not limited thereto.

In summary, in the cantilever probe card device 1000 (or the cantilever probe module 100) of the present embodiment, the second probe 2 is provided with the roughened surface 28 formed on a region thereof adjacent to the pinpoint portion 231, so that the detection apparatus 3000 can precisely obtain the position of the pinpoint portion 231 for facilitating the operation of the cantilever probe card device 1000.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A cantilever probe card device, comprising:

a substrate including a plurality of first soldering pads and a plurality of second soldering pads, wherein the first soldering pads are arranged in a first row along an arrangement direction, and the second soldering pads are arranged in a second row along the arrangement direction, and wherein the second row is parallel to and spaced apart from the first row; and a cantilever probe module fixed onto the substrate and including:

a plurality of first probes each being integrally formed as a single one-piece structure and including:

a first main segment having a first soldering end portion and a first extending end portion respectively arranged on two opposite sides thereof along a predetermined direction that is perpendicular to the arrangement direction;

a first arm segment connected to the first extending portion of the first main segment; and a first testing segment having an upright shape along the predetermined direction and connected to the first arm segment; and a plurality of second probes staggeredly arranged with the first probes, wherein each of the second probes is integrally formed as a single one-piece structure and includes:

a second main segment having a second soldering end portion and a second extending end portion respectively arranged on two opposite sides thereof along the predetermined direction, wherein the second main segment has a main height along the predetermined direction;

an extending segment connected to the second main segment, wherein the extending segment has an extension height along the predetermined direction, and wherein the extension height is within a range from 5% to 50% of the main height;

a second arm segment connected to the extending segment; and a second testing segment having an upright shape along the predetermined direction and connected to the second arm segment;

wherein the first soldering end portions of the first probes are fixed onto the first soldering pads, the second soldering end portions of the second probes are fixed onto the second soldering pads, and the first testing segments of the first probes and the second testing segments of the second probes are arranged in one row along the arrangement direction;

wherein, when the first testing segments of the first probes and the second testing segments of the second probes jointly abut against a device under test (DUT), a pressure generated in the first testing segment of any one of the first probes is within a range from 95% to 105% of a pressure generated in the second testing segment of any one of the second probes;

wherein, in any one of the second probes, the second main segment defines a layout region arranged inside of an outer contour thereof by a layout spacing, the second soldering end portion and the second extending end portion are respectively located at two opposite sides of the layout region along the predetermined direction, and the layout region has a plurality of thru-holes that occupy 3% to 70% of a region surroundingly defined by the outer contour, and wherein the layout spacing is within a range from 20 μm to 100 μm, an inner diameter of any one of the thru-holes is less than or equal to 100 μm, and any two of the thru-holes adjacent to each other have a spacing therebetween that is within a range from 10 μm to 50 μm.

2. The cantilever probe card device according to claim 1, wherein shapes of the first main segment, the first arm segment, and the first testing segment of any one of the first probes are respectively identical to shapes of the second main segment, the second arm segment, and the second testing segment of any one of the second probes.

3. The cantilever probe card device according to claim 2, wherein the second arm segment of any one of the second probes has an arm height along the predetermined direction, and wherein the arm height is within a range from 5% to 50% of the extension height.

4. The cantilever probe card device according to claim 3, wherein, when the first testing segments of the first probes and the second testing segments of the second probes jointly abut against the DUT, each of the first probes is only deformed in the first arm segment, and each of the second probes is only deformed in the second arm segment.

5. The cantilever probe card device according to claim 2, wherein, in any one of the second probes, an edge of the second extending end portion is flush with an edge of the extending segment and an edge of the second arm segment, and wherein outer contours of the first probes are flush with each other along the arrangement direction, and outer contours of the second probes are flush with each other along the arrangement direction.

6. The cantilever probe card device according to claim 1, wherein the first soldering pads of the first row are spaced apart from the second soldering pads of the second row by an offset distance along an extending direction that is perpendicular to the arrangement direction and the predetermined direction, and the extending segment of any one of the second probes has an extension distance along the extending direction, and wherein the extension distance is within a range from 95% to 105% of the offset distance.

7. The cantilever probe card device according to claim 6, wherein any two of the second probes adjacent to each other are provided with one of the first probes therebetween, and any one of the first probes and an adjacent one of the second probes have a spacing along the arrangement direction, and wherein the spacing is within a range from 20 μm to 200 μm.

8. The cantilever probe card device according to claim 1, further comprising a plurality of solders, wherein each of the first soldering end portions is soldered and fixed onto the corresponding first soldering pad through one of the solders, and each of the second soldering end portions is soldered and fixed onto the corresponding second soldering pad through one of the solders; and wherein, in each of the second probes, the thru-holes are in a matrix arrangement having a plurality of rows, the thru-holes in one of the rows are arranged adjacent to the second soldering end portion and are each defined as a solder receiving hole that receives a part of the corresponding solder.

9. A cantilever probe module, comprising:

a plurality of first probes each being integrally formed as a single one-piece structure and including:

a first main segment having a first soldering end portion and a first extending end portion respectively arranged on two opposite sides thereof along a predetermined direction;

a first arm segment connected to the first extending portion of the first main segment; and a first testing segment having an upright shape along the predetermined direction and connected to the first arm segment; and a plurality of second probes staggeredly arranged with the first probes, wherein each of the second probes is integrally formed as a single one-piece structure and includes:

a second main segment having a second soldering end portion and a second extending end portion respectively arranged on two opposite sides thereof along the predetermined direction, wherein the second main segment has a main height along the predetermined direction;

an extending segment connected to the second main segment, wherein the extending segment has an extension height along the predetermined direction, and wherein the extension height is within a range from 5% to 50% of the main height;

a second arm segment connected to the extending segment; and a second testing segment having an upright shape along the predetermined direction and connected to the second arm segment;

wherein, when the first soldering end portions of the first probes and the second soldering end portions of the second probes are fixed onto a substrate, the first testing segments of the first probes and the second testing segments of the second probes are arranged in one row along an arrangement direction perpendicular to the predetermined direction;

wherein, in any one of the second probes, the second main segment defines a layout region arranged inside of an outer contour thereof by a layout spacing, the second soldering end portion and the second extending end portion are respectively located at two opposite sides of the layout region along the predetermined direction, and the layout region has a plurality of thru-holes that occupy 3% to 70% of a region surroundingly defined by the outer contour, and wherein the layout spacing is within a range from 20 μm to 100 μm, an inner diameter of any one of the thru-holes is less than or equal to 100 μm, and any two of the thru-holes adjacent to each other have a spacing therebetween that is within a range from 10 μm to 50 μm.

*     *     *     *     *